United States Patent [19]

Bates, Jr.

[11] Patent Number: 4,816,183

[45] Date of Patent: Mar. 28, 1989

[54] COMPOSITE PHOTOSENSITIVE MATERIAL

[75] Inventor: Clayton W. Bates, Jr., Palo Alto, Calif.

[73] Assignee: The Board of Trustees of the Leland Stanford Junior University, Stanford, Calif.

[21] Appl. No.: 898,918

[22] Filed: Aug. 21, 1986

[51] Int. Cl.[4] .................. H01B 1/06; H01C 13/00
[52] U.S. Cl. .................. 252/501.1; 252/514; 252/512; 252/518
[58] Field of Search .................. 252/501.1, 514, 512, 252/518; 430/62, 63, 84, 85; 357/31, 30, 29; 250/211 R, 211 J

[56] References Cited

U.S. PATENT DOCUMENTS

| | | | |
|---|---|---|---|
| 2,829,422 | 4/1958 | Fuller | 29/253 |
| 3,252,029 | 5/1966 | Van Loon Shallcross | 313/65 |
| 3,387,161 | 6/1968 | Van Laar | 313/94 |
| 3,632,442 | 1/1972 | Turnbull | 117/219 |
| 3,753,023 | 8/1973 | Sommer | 313/103 |
| 3,955,082 | 5/1976 | Dyment | 250/211 |
| 3,989,982 | 11/1976 | Schaufele | 315/169 |
| 4,029,604 | 6/1977 | Enoki | 252/501 |
| 4,044,372 | 8/1977 | Weinstein | 357/30 |
| 4,409,134 | 10/1983 | Yamazaki | 252/501.1 |

OTHER PUBLICATIONS

"Photoemission from Ag-O-Cs", by Clayton W. Bates, Jr., Phys. Rev. Letters, vol. 47, No. 3, Jul. 20, 1981, (pp. 204–208).

"Enhanced Raman Scattering from Cesium Suboxides on Silver Particles and the Structure of S-1 Photocathodes", by Clayton W. Bates, Jr., Appl. Phys. Letters, 45(10), Nov. 15, 1984, (pp. 1058–1059).

"Optical Properties of Inhomogenous Composite Materials", by N. Alexander and C. W. Bates, Jr., Solid State Comm., vol. 51, No. 5, pp. 331–333, 1984.

Primary Examiner—Josephine Barr
Attorney, Agent, or Firm—Gregory O. Garmong

[57] ABSTRACT

A composite photosensitive material of enhanced sensitivity to, and absorption of, incident radiation, wherein an array of particles of an electrically conducting material is embedded in and dispersed through a semiconducting matrix transparent to the wavelengths of interest, the particles having sizes of from about 1 to about 100 nanometers and having volume fractions of at least about 10 percent. The composite material is usable in photosensitive device applications such as detectors, photocells, photodiodes, and vidicons. Sensitivity to infrared radiation is particularly high where the matrix has a dielectric constant of at least about 10. The preferred particle material for enhanced infrared sensitivity is silver or gold, and the preferred matrix is silicon of $CuInSe_2$.

11 Claims, 2 Drawing Sheets

COMPOSITE PHOTOSENSITIVE MATERIAL

BACKGROUND OF THE INVENTION

This invention relates to photosensitive materials and their use, and, more particularly, to such materials having enhanced sensitivity to incident radiation.

Photosensitive materials are those whose electrical conductivity or emissivity varies in relation to the wavelength and intensity of radiation incident upon the material. Photosensitive materials are typically semiconductors whose electronic structure is sensitive to the incident radiation. Such photosensitive materials have many applications, one example being a detector for indicating the presence of light, commonly termed a photocell. When a beam of light falls upon such a photocell, the electrical conductivity or electron emission of the photosensitive material in the photocell is altered, and this change serves as the basis for quantitatively measuring the intensity of incident light. Another example is the photodiode, wherein incident radiation changes the conductivity of a p/n semiconductor junction in relation to the wavelength and intensity of the incident radiation, thereby permitting electrical current to flow.

Photosensitive materials are also utilized in vidicons, which are devices used to convert images to electrical signals. The vidicon may be used as the camera in a television. In a typical vidicon, a thin layer of a photosensitive material is deposited upon an electrically conducting, transparent plate. Light from a scene imaged onto the vidicon passes through the plate and strikes the thin layer of photoabsorbing material, thus causing the electrical conductivity or electron emission of the thin layer to vary from place to place because of the variations in the light intensity of the image. To form an image in the photoconductive mode, for example, an electron beam is scanned across the free surface of the photosensitive layer, so that the electrical current reaching the conducting plate at any moment is depending upon the local electrical conductivity of the photosensitive material. This electrical signal is then transmitted to a receiver, and can be reconstructed into an image to be viewed. Thus, the photosensitive material lies at the heart of such a vidicon.

Photosensitive materials are also used in a photoemissive mode, wherein the incident light causes emission of electrons from the surface of the photosensitive material. This mode has particular advantages, including high gain, with a relatively large electron emission per incident photon, and low noise.

A photosensitive material should exhibit high absorption of incident radiation, of wavelengths of interest, with a corresponding large variation in electrical properties due to the absorption. Continuing with the example of the vidicon for imaging incident radiation, it is necessary that the variation in electrical properties of the photosensitive material be large, in order to obtain good contrast in the reconstructed image.

One prior approach to achieving such a high variation in photoconductivity was to make the photosensitive layer thick. However, use of a thick layer reduces the resolution of the vidicon because of electronic and optical diffusion effects. If the photosensitive layer is kept thin, on the other hand, there may be insufficient absorption of radiation to produce the necessary conduction or emission contrast, unless the thin layer absorbs a sufficiently large amount of incident radiation to produce the required electrical variation. There is therefore an ongoing need for photosensitive materials which exhibit increased absorption of incident radiation. Increased absorption allows reduced thickness of the photosensitive layer and a resulting improvement in contrast and resolution for the viewer.

Light and related types of energy exist across a broad spectrum of wavelengths. As an example, visible light ranges from about 100 to about 800 nanometers in wavelength, with violet light having the shortest wavelengths and red light having the longest wavelengths. Ultraviolet radiation has a wavelength below the visible spectrum, while infrared light has a wavelength above the visible spectrum. A number of photosensitive materials have been developed for detecting visible light, and are used in many device applications. Unfortunately, no known materials are strongly photosensitive to all wavelengths of radiation. The photosensitive materials currently used to detect visible radiation are generally relatively insensitive to ultraviolet and infrared radiation.

It is also of interest to detect and image radiation having wavelengths that are not visible to the human eye. These wavelengths include the ultraviolet spectrum at wavelengths below 100 nanometers, and the infrared spectrum at wavelengths of about 800 nanometers to 3000 nanometers for the near-infrared spectrum, and upwardly to about 8000 nanometers for the far-infrared spectrum. Although such radiation is not visible to the human eye, its detection and imaging can be of great importance for such applications as astronomy and photographing the earth's resources from space. The photosensitive materials that are presently used to detect visible light typically have only very weak absorption of ultraviolet and infrared radiation, and therefore do not yield high quality devices such as photodetectors, photodiodes, photocells, and vidicons sensitive to radiation in these ranges. Consequently, many present devices sensitive to non-visible radiation do not have the high output, contrast and resolution found in devices sensitive to visible light.

Accordingly, there exists a need for improved photosensitive materials having high absorption of, and sensitivity to, radiation in the ultraviolet and infrared spectra. Such materials should be compatible with existing device designs, and must be fabricable in thin layers of controlled crystallographic characteristics. They should also be stable to microstructural changes in a vacuum and under the influence of an electron beam. The present invention fulfills this need, and further provides related advantages.

SUMMARY OF THE INVENTION

The present invention is embodied in a photosensitive material of high absorption and sensitivity to selected wavelengths of radiation. The material may be used in devices such as detectors, photodiodes, solar cells, and vidicons, essentially without change to the device except for the use of a thinner layer of photosensitive material than possible with prior photosensitive materials, which improves output, contrast, and resolution of the incident radiation. The material may be tailored to have broadband absorption or a narrow spectral response, allowing construction of specialized devices as needed in particular applications. The material can be fabricated in thin layers of particular crystallographic characteristics, and is stable to microstructural change in vacuum or when heated or irradiated.

In accordance with the invention, a photosensitive material of enhanced sensitivity to incident radiation of a selected wavelength comprises a semiconducting matrix transmissive to radiation of the selected wavelength; and an array of particles of an electrically conducting material embedded in and dispersed throughout the matrix, the particles having sizes of from about 1 to about 100 nanometers and having a volume fraction of at least about 10 percent of the material, there being no reactive phase present between the particles and the matrix that would interfere with the interaction of the incident radiation and the material. The matrix material, particle material, particle size, particle shape, particle distribution, particle volume fraction, and layer thickness of the photosensitive material can be varied to achieve broadband or narrow spectral response of the material to incident radiation, as desired. The particles are dispersed throughout the matrix, not just at the surface of the matrix, to achieve the necessary volume fraction and effect. In a currently preferred embodiment, the material is tailored to be sensitive to infrared radiation by furnishing an infrared-transparent matrix having a dielectric constant greater than about 10.

In accordance with this embodiment, a photosensitive material of enhanced sensitivity to infrared radiation having a wavelength of greater than about 800 nanometers comprises a semiconducting matrix transmissive to infrared radiation and having a dielectric constant of at least about 10; and an array of particles of an electrically conducting material embedded in and dispersed through the matrix, the particles having sizes of from about 1 to about 100 nanometers and having a volume fraction of at least about 10 percent of the material, there being no reactive phase present between the particles and the matrix, whereby the material absorbs infrared radiation having wavelengths of greater than about 800 nanometers. Preferably, the matrix is silicon or $CuInSe_2$, and the dispersed, embedded particles are silver or gold. The particles preferably have sizes of from about 2.5 to about 20 nanometers, most preferably about 5 nanometers. The preferred volume fraction of the particles is from about 20 to about 80 percent of the material. Some of the particles may be grouped together in clusters, and the characteristics of the clusters may be changed to vary the spectral response of the photosensitive material.

The infrared photosensitive materials are used in devices, such as the infrared sensitive vidicon. In this application, the photosensitive material is formed into a layer having one dimension of less than about 1000 nanometers, with the dielectric constant of the matrix preferably at least about 12. In another application, the output of a solar cell is improved by matching the spectral response of the photosensitive material in the cell to that of natural sunlight.

In another aspect of the invention, a process for absorbing radiation of a selected wavelength comprises providing an absorbing material having a semiconductor matrix transmissive to radiation of the selected wavelength and an array of particles of an electrically conducting material embedded in and dispersed through the matrix, the particles having sizes of from about 1 to about 100 nanometers and having a volume fraction of at least about 10 percent of the material, there being no reactive phase present between the particles and the matrix; and positioning the material to receive radiation of the selected wavelength, whereby the material can absorb some of the incident radiation. Such a process usually includes the further step of installing the material into a device. The process can be used in conjunction with the preferred embodiment of the invention, wherein the matrix is transmissive to infrared radiation and has a dielectric constant of at least about 10. In this preferred embodiment, the matrix material is most preferably silicon or $CuInSe_2$, and the most preferred particle material is silver or gold.

The photosensitive material of the invention exhibits enhanced absorption of selected portions of the radiation spectrum. By changing the matrix material, the thickness of the layer of photosensitive material, and the type and distribution of the particles in the matrix, the spectral sensitivity of the photosensitive material can be controllably varied. This permits construction of devices to detect a broad spectrum of selected wavelengths of incident radiation, or particular narrow spectra of wavelengths such as certain infrared wavelengths, as necessary for particular applications. The high absorption coefficient of the material allows it to be utilized in very thin layers, so that imaging devices produced with such a photosensitive material have enhanced contrast and resolution, as compared with prior vidicons. The photosensitive material of the present invention may be produced in a number of ways, including spray techniques which allow uniform layers to be readily and economically prepared. Other features and advantages of the present invention will become apparent from the following more detailed description, taken in conjunction with the accompanying drawings, which description illustrates, by way of example, the principles of the invention.

DETAILED DESCRIPTION OF THE PREFERRED EMBODIMENT

Figure 1:
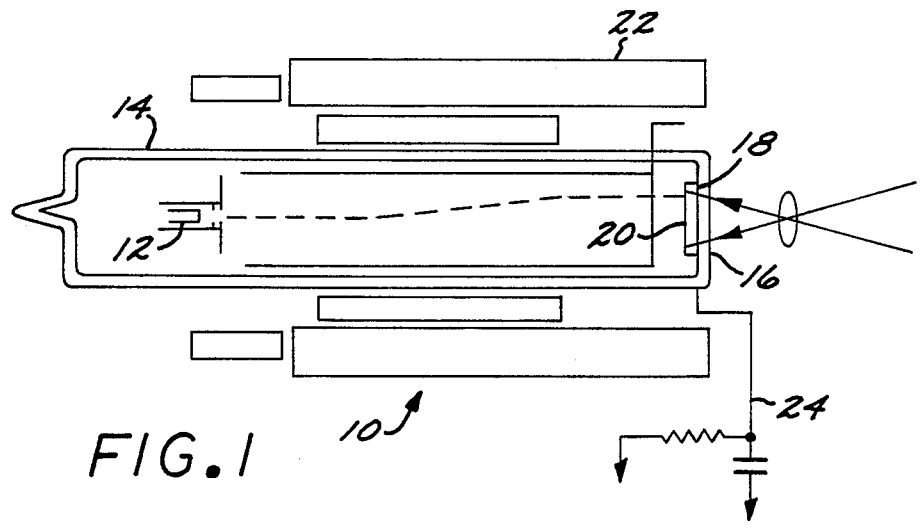
FIG. 1 is a schematic side sectional view of a vidicon tube.

The present invention is embodied in a photosensitive material having enhanced absorption of radiation of selected wavelengths. The enhanced absorption allows this material to be fabricated in the form of thin layers which are particularly suitable for use in imaging devices such as a vidicon tube 10 schematically illustrated in FIG. 1.

The vidicon tube 10 includes an electron gun 12 mounted within an evacuated glass envelope 14. One surface of the glass envelope 14 is a transparent window 16. Adjacent the window 16 is a transparent, electrically conductive signal plate 18, upon which is deposited a thin layer 20 of a photosensitive material. Incident radiation such as light from an external scene is imaged onto the photosensitive layer 20. Because of the photosensitive nature of this layer 20, the electrical conductivities of various regions of the layer 20 are different, depending upon the wavelength and intensity of the radiation imaged upon each region.

The local variations in electrical conductivity may be detected by scanning an electron beam produced by the electron gun 12 across the free surface of the photoabsorbing layer 20, using conventional deflection and focusing coils 22. As the electron beam scans the photosensitive layer 20, the current flowing to an external circuit 24 at any moment is dependent upon the electrical conductivity of the region of the photosensitive layer 20 being scanned at that moment. The video signal in the circuit 24 therefore depends upon the light intensity of the imaged region. The video signal is transmitted to a receiver (not shown), wherein the image is reconstructed by modulating an electron beam which scans a fluorescent surface, thereby converting the electrical signal into an image visible to the human eye. Many variations have been developed, and this description is intended only to be illustrative of one basic approach. However, in all such systems, the character of the video signal and the reconstructed image is dependent upon the photosensitive characteristics of the layer 20.

Vidicons for imaging visible light have received great attention, but high absorption photosensitive materials for detecting other portions of the spectrum, ultraviolet and infrared wavelengths, are not available. The presently most preferred embodiments of the invention are those having high absorption and sensitivity outside the visible spectrum, and most particularly photosensitive materials that are sensitive to the infrared wavelengths of incident radiation.

Satisfactory photosensitive materials for use in detecting visible light, having a wavelength of from about 100 to about 800 nanometers, are well known. The photoabsorption of semiconductor materials is dependent upon the wavelength of the light incident upon the material, and generally the known photosensitive materials that are sensitive to visible light are not strongly sensitive to raidation having longer wavelengths. In particular, the known materials exhibit significantly reduced photoabsorption for infrared radiation having a wavelength of greater than about 800 nanometers. Such materials therefore cannot practically be used in the vidicon 10, if the purpose of the vidicon 10 is to image infrared radiation rather than visible light. The presently most preferred embodiment is directed to photosensitive materials which have particularly enhanced photoabsorption for infrared light having a wavelength greater than about 800 nanometers, although such materials may also be incidentally photoabsorbing for visible light. That is, the materials of this preferred embodiment of the invention are to be distinguished from conventional materials that are photosensitive for visible light for the reason that such conventional materials do not exhibit substantial photosensitivity for radiation of infrared wavelengths.

In accordance with this embodiment, the photoabsorbing material comprises a semiconducting matrix transmissive to infrared radiation and having a dielectric constant of at least about 10, and further includes an array of particles of electrically conducting material embedded in and dispersed through the matrix. The particles are present in a volume fraction of at least about 10 percent of the total volume of the material, and have sizes from about 1 to about 100 nanometers. Two preferred matrix materials are silicon, which has a dielectric constant of about 12, and $CuInSe_2$, which has a dielectric constant of about 15. The invention is not limited to these two materials, but is applicable for any matrix material which transmits the selected wavelengths of radiation.

Figure 2:
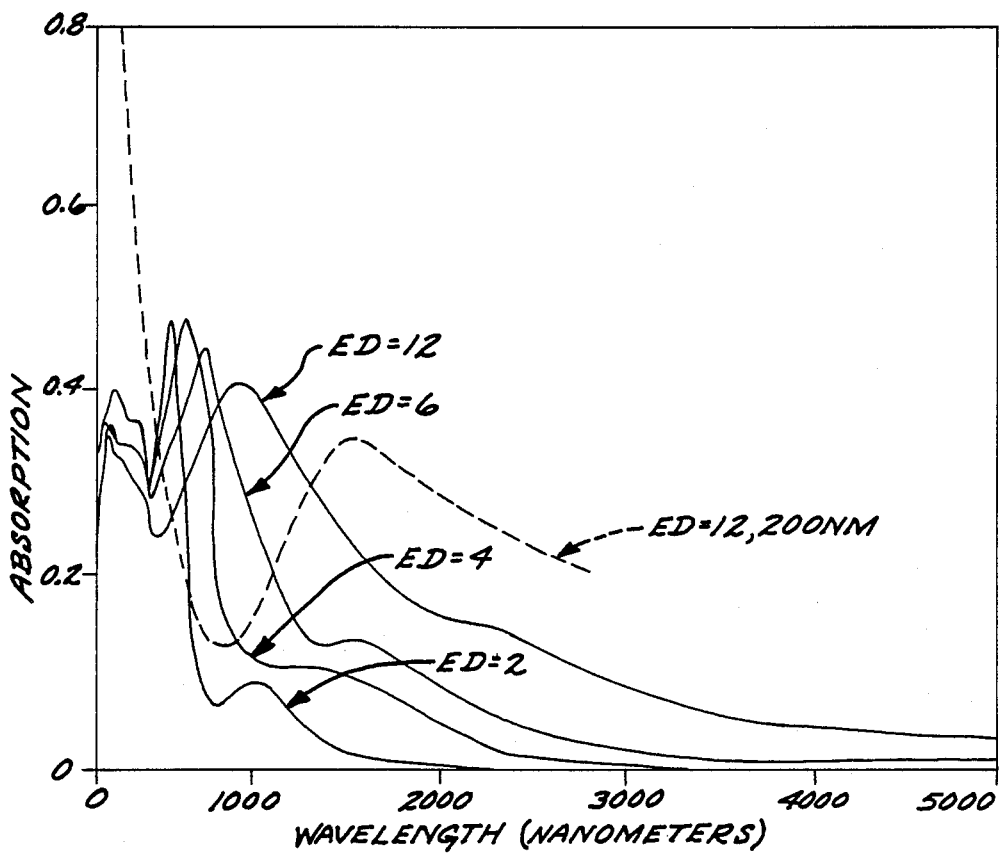
FIG. 2 is a graph showing calculated absorption spectra of a layer having gold particles embedded in and dispersed through matrices of varying dielectric constant.

FIG. 2 presents a calculation of the absorption of arrays of gold particles in matrices of differing dielectric constants ED, ranging from 2 to 12. In this calculation, the gold conducting particles are assumed to be 5 nanometers in diameter and present in 40 volume percent of a layer 10 nanometers thick. In one case presented for comparison, the thickness of the layer is 200 nanometers and the dielectric constant is 12, with all other parameters the same. There is assumed a slight clustering of the gold particles, so that 98 percent of the particles are surrounded by the dielectric matrix material and 2 percent of the dielectric material is surrounded by particle material.

The curve corresponding to a matrix dielectric constant of 2 shows a minor amount of absorption at wavelengths greater than about 1000 nanometers. The absorption at such wavelengths increases for increasing dielectric constants for the matrix, as the absorption peak moves to higher wavelengths for increasing values of the dielectric constant. For a dielectric constant of 6, the major absorption peak is at about 700–800 nanometers, marginally at the high end of the visible spectrum and beginning to extend into the infrared region. The calculated curve for a dielectric constant of the matrix of about 12 exhibits an absorption of nearly 0.4 at a wavelength of about 1000 nanometers, and an absorption greater than 0.1 at wavelengths as high as about 3000 nanometers. By interpolation of this FIG. 2 and other similar calculations for various particle types and distributions, it is determined that a matrix medium having a dielectric constant greater than about 10 has sufficient absorption of infrared radiation to be of the greatest sensitivity. Use of a thicker layer moves the absorption peak to higher wavelengths.

An array of particles of an electrically conducting material is embedded in and dispersed through the matrix. The presence of the particles is critical to the operability of the invention. As used herein, a particle is a distinct phase which is separated from its surrounding matrix structure by a phase boundary. In the past, it has been known to incorporate alloying elements into photoabsorbing materials, in the form of solid solution additions. The presence of other elements in the form of a solid solution addition is to be distinguished from their presence in the form of a particle or separate phase. The present invention requires the presence of second components as particles or separate phases, and is not operable if the second components are present only as solid solution addition. The particles are required because their presence results in an inhomogeneous structure of varying dielectrical constants on the necessary scale to produce the desired radiation absorption. By contrast, a solid solution addition results in a modification of the dielectric constant of the matrix, but the modified dielectric constant is substantially uniform and continuous throughout the matrix on the scale of tens of nanometers. The presence of a solid solution addition to the matrix is not normally detrimental to the operability of the invention, if the necessary array of particles of electrically conducting material is also present. In many situations, the semiconductor matrix having embedded particles is doped with a charge carrier dopant to modify its energy states.

The particles of electrically conducting material embedded in and dispersed through the matrix have sizes of from about 1 to about 100 nanometers. Substantially smaller or larger particles do not have the desired effect in enhancing the photosensitive properties. The different effect of the presence of smaller and larger particles is possibly due to their different interaction with the incident radiation. The particles may be spherical, or have other morphologies such as ellipsoidal or irregular. As used herein, the size of the particle is its average diameter as determined in a quantitative metallographic sense. Various shapes of particles are acceptable, and it is believed that the precise absorption characteristics can be modified by the selection of particular shapes.

Particles having sizes of from about 1 to about 100 nanometers are operable. Particles having sizes of from about 2.5 to about 20 nanometers are preferred, as the absorption per unit volume of the photosensitive material appears to be increased for particles in this size range. Most preferably, the particles have a size of about 5 nanometers, since the absorption per unit volume appears to be maximized for particles of about this size.

The volume fraction of particles is greater than about 10 percent by volume of the photosensitive material. Preferably, the volume fraction of the particles of electrically conducting material is from about 20 to about 80 percent. Lesser volume fractions of particles are operable, down to about 10 percent by volume, but have a less desirable photoabsorbing potential. Volume fractions of the particles of electrically conducting material greater than about 80 percent result in an insufficient amount of the matrix being present to achieve the necessary absorption.

The particles are embedded in and distributed through the matrix, in order to achieve a relatively high volume fraction of the entire volume of the solid. This morphology is distinguished from structures wherein the particles reside primarily at the surface of the matrix only, and are thereby restricted to volume fractions of about one percent or less. The presence of a significantly higher volume fraction of the particles is necessary, and only distribution of the particles through the matrix can achieve the necessary volume fractions on the order of 10 percent and greater.

In one embodiment, the electrically conducting particles are distributed substantially uniformly throughout the matrix. In another embodiment, the particles may be dispersed throughout the matrix in a somewhat nonuniform manner. In this latter embodiment, the particles may be clustered slightly. That is, some particles may have their neighboring particles located closer than do other particles. In yet other instances, groups of particles may be clustered so tightly together that portions of the matrix are completely surrounded by particles and isolated form other portions of the matrix. In this circumstance, the matrix remains that material that is transparent to the selected radiation. The composite may be characterized as having a fraction of particles surrounded by matrix and a fraction of matrix surrounded by particles. This clustering parameter may be varied to alter the selectivity and maximum absorption of the photoabsorbing material to different wavelengths of incident radiation.

The matrix material in which the particles are embedded and distributed must be transmissive of the selected incident radiation, and, in the case of the preferred embodiment, must have a dielectric constant of at least about 10. Silicon and $CuInSe_2$ are acceptable as matrix materials for infrared applications. The particles are electrically conductive, and preferably are metals. The particles should not chemically react with the matrix material or with impurities, dopants, free gases, or dissolved gases to produce an intermediate phase lying at the interface between the particles and the matrix. Such an intermediate phase is deleterious to the photoabsorbing interaction of the radiation of the selected wavelength with the particles and matrix. Preferably, the particles are gold or silver, which are relatively noble and unreactive in the preferred matrix materials, but are electrically conductive.

The various combinations of matrix and particles of electrically conducting material described previously are operable in a photosensitive material of enhanced sensitivity to infrared radiation, and the various composite structural parameters may be adjusted to vary the spectral response of the photosensitive material. That is, the photosensitive material does not absorb all wavelengths of infrared radiation equally, and the photoabsorption may be calculated and graphed as a function of wavelength, as in FIGS. 2 and 3. In FIG. 2, the material having a matrix dielectric constant of 12 and a thickness of 10 nanometers exhibits a peak absorption response near 1000 nanometers wavelength, and relatively broad response (although of decreasing absorption) at higher and lower wavelengths of incident radiation. Structural parameters may be varied to achieve a photoabsorbing material having enhanced absorption for particular infrared radiation wavelengths. It may be desirable to construct a photocell or vidicon that is sensitive only to that portion of the spectrum including infrared radiation of particular wavelengths. For example, if it is known that certain astronomical features produce infrared radiation of a particular wavelength while the general astronomical background produces infrared radiation of other wavelengths, the features of interest may be selectively imaged or detected by selecting the photoabsorbing material to be optimally sensitive to the infrared radiation of the particular wavelengths of interest.

Figure 3A:
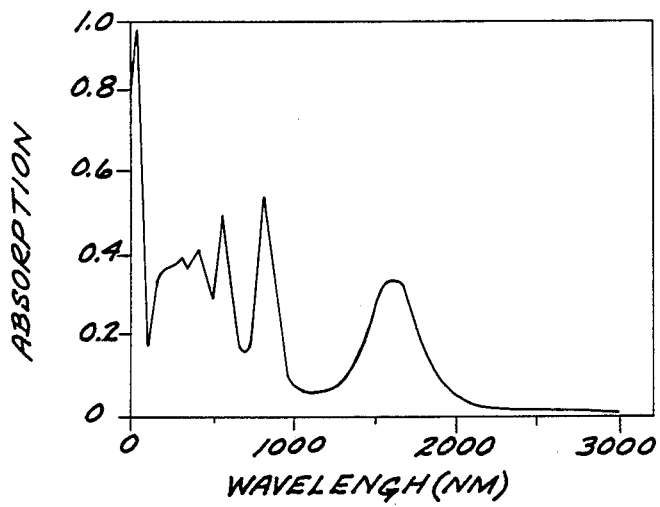
FIG. 3 are graphs showing calculated absorption spectra of layers of silver particles in $CuInSe_2$ matrices, with varying layer thicknesses of (A) 1000 nanometers, (B) 1400 nanometers, and (C) 1600 nanometers.
Figure 3B:
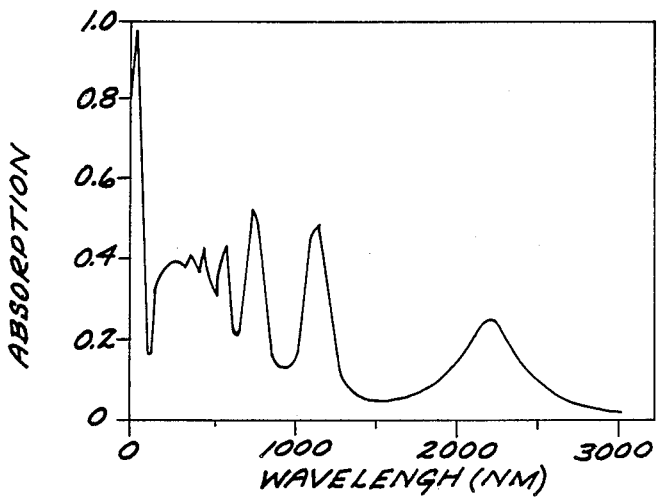
Figure 3C:
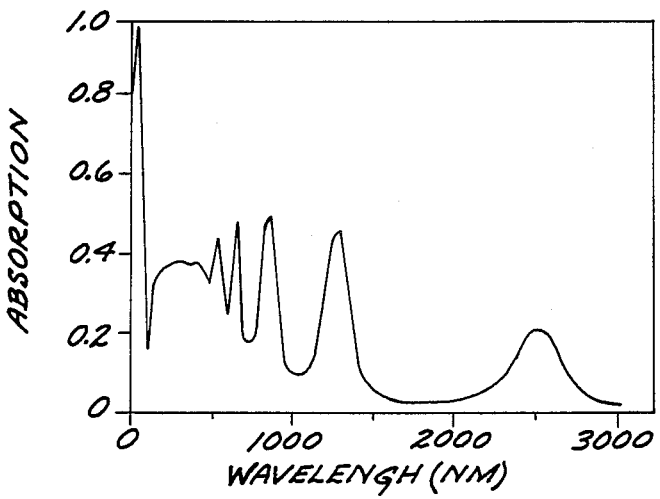

FIG. 3 illustrates the possibilities for tailoring the photosensitive material to optimal sensitivity at various infrared wavelengths, by adjusting one of the parameters of the material. In this case, the thickness of the photoabsorbing layer is varied from 1000 nanometers in FIG. 3A to 1400 nanometers in FIG. 3B and 1600 nanometers in FIG. 3C, with the other system parameters remaining constant. The increasing thickness shifts the absorption peaks to increasing infrared wavelengths, allowing maximum absorption at values of from about 1600 to about 2600 nanometers. The other parameters may also be varied to tailor the optimal photoabsorption of the material in the infrared.

The photosensitive materials of the present invention may be fabricated by any appropriate technique which produces the structures indicated previously. The selected fabrication procedure depends upon the particular structure desired and the materials chosen for the matrix and the particles.

In one approach to fabricating a photosensitive material having silver particles in a silicon matrix, a 30 nanometer layer of silicon is deposited upon a sapphire substrate of crystallographic orientation (1012). Alternative 20 nanometer thick layers of silver and silicon are then deposited to build up a composite structure. Deposition is accomplished by electron beam procedures at a substrate temperature of about 650° C. to produce polycrystalline silicon, whereas lower temperature deposition would produce amorphous silicon. Amorphous silicon could be used after hydrogenation or passivation to eliminate unsaturated bonds which would absorb electrons.

A preferred approach for preparing a photoabsorbing material of silver particles in a $CuInSe_2$ matrix is chemical spray pyrolysis. In this approach, a 10–20 nanometer thick layer of silver is first deposited onto a piece of glass such as 7059 type glass available from Corning Glass Company. The piece of glass and the deposited layer are heated to a temperature of about 380° C. for about 10 minutes in a nitrogen gas environment, resulting in the spheroidization of the silver layer into discrete particles on the glass substrate. A mixture of aqueous solutions of reactants is then sprayed onto the hot substrate at temperatures of from about 250° C. to about 300° C. to fill in the spaces between the particles. The spray solution is typically a 0.01 M solution of $CuCl_2$, n,n-dimethylselenourea, and $InCl_3$, with the Cu:In:Se ratios varying from about 1.1:1:4 to about 0.8:1:4. These ratios produce p-type $CuInSe_2$. To convert a film to n-type $CuInSe_2$, the film is heated at 300° C. in an underpressure of selenium. The sprayed chemicals react to produce a matrix material of $CuInSe_2$ in which the silver particles are embedded. The process can be repeated to build up thicker layers.

It is anticipated that other fabrication techniques may be utilized for these and other combinations of particles and matrices. No limitation on the nature of the fabrication approach is known, although particular fabrication techniques may have advantages in producing particular morphologies and purities in the photosensitive material.

The following examples are presented to illustrate aspects of the invention, but should not be taken as limiting the invention in any respect.

EXAMPLE 1

A photosensitive material of silver particles in a silicon matrix was fabricated by the technique first described above. The composite photosensitive material had about 40 volume fraction of silver particles, the particles having an average size of about 30 nanometers. The layer of photosensitive material was about 110 nanometers thick. There was some clustering of the silver particles, with about 98 pecent of the silver particles surrounded by silicon, and about 2 percent of the silicon surrounded by silver. The material had a selective absorption peak centered at about 2000 nanometers with a half width of about 300 nanometers. The half width can be narrowed by reducing the size of the silver particles to about 5 nanometers. The absorption behavior of the composite photosensitive material was significantly different than that of either the silver or the silicon or any simple arithmetic combination of the two materials. Silver is not transparent to infrared radiation. Silicon transmits infrared radiation, but the absorption of the described composite photosensitive material at a wavelength of 2000 nanometers is more than 1000 times greater than that of a piece of pure silicon of the same thickness. That is, the photoabsorbing capability of the composite photosensitive material of the present invention is unexpectedly great, and may be tailored to be selective at particular wavelengths.

EXAMPLE 2

A photoabsorbing material of silver particles in $CuInSe_2$ was prepared. The average particle size of the silver particles was slightly less than 10 nanometers, with essentially all of the silver surrounded by the $CuInSe_2$ matrix. The volume fraction of silver was about 30 percent, and the photosensitive material was prepared as a layer about 160 nanometers in thickness. The photosensitive material exhibited absorption of infrared radiation beginning at 2500 nanometers, whereas pure $CuInSe_2$ (not having any particles) begins absorbing at about 1200 nanometers.

The preferred embodiment is found in infrared photosensitive materials, but the approach is applicable to photosensitive materials for other portions of the spectrum. A material comprising conducting particles embedded and distributed through a matrix transparent to ultraviolet radiation, exhibits increased absorption of ultraviolet radiation.

The properties of existing photosensitive materials can also be substantially altered using the approach of the present invention. For example, the well known S-1 photoemitter is most strongly sensitive to radiation in the visible spectrum. The S-1 photoemitter is comprised of a base layer of $Cs_2O$ with relatively large silver particles lying therein, and a surface layer of silver particles of about 5 nanometers in diameter in vacuum. The large response of the conventional S-1 photoemitter at 800 nanometers wavelength is thought to be due to the presence of the surface silver particles forming clusters. The present invention provides for embedding smaller particles of silver, of a diameter preferably of about 5 nanometers, dispersed throughout the $Cs_2O$ matrix to obtain a photoelectric response beyond 800 nanometers wavelength.

The photosensitive materials of the present invention have substantially increased photoabsorption as compared with prior materials. Due to the increased photoabsorption, useful photoabsorbing layers may be fabricated in thinner dimensions than previously possible. Greater resolution and contrast in imaging photosensitive devices is therefore possible. Improved photosensitive materials may be advantageously used in other devices such as photomultiplier tubes, direct view imaging tubes, photovoltaic energy conversion devices such as solar cells, and others. In these and other applications, the enhanced photoabsorbing character results in a greater efficiency of conversion of incident radiation to electrical signals. Moreover, by varying the materials used and the morphological and structural characteristics of the composite photosensitive materials, the sensitivity of the photosensitive materials may be adjusted to broad band sensitivity or narrow band sensitivity to selected wavelengths. The photosensitive materials of the invention may be made by various techniques as thin or thick layers, as required in particular applications.

Although particular embodiments of the invention have been described in detail for purposes of illustration, various modifications may be made without departing from the spirit and scope of the invention. Accordingly, the invention is not to be limited except as by the appended claims.

What is claimed is:

1. A photosensitive material of enhanced sensitivity to incident radiation of a selected wavelength, comprising:
   a semiconductor matrix transmissive to radiation of the selected wavelength, said matrix being selected from the group consisting of silicon and $CuInSe_2$; and
   an array of particles of an electrically conducting material embedded in and dispersed through said matrix, said particles being selected from the group consisting of silver and gold, said particles having sizes of from about 1 to about 100 nanometers and having a volume fraction of at least about 10 percent of said material, there being no reactive phase present between said particles and said matrix that would interfere with the interaction of the incident radiation and the material.

2. The material of claim 1, wherein said particles have sizes of from about 2.5 to about 20 nanometers.

3. The material of claim 1, wherein the volume fraction of said particles is from about 20 percent to about 80 percent.

4. The material of claim 1, wherein the matrix is doped to modify its electrical properties.

5. A photosensitive material of enhanced sensitivity to infrared radiation having a wavelength of greater than about 800 nanometers, comprising:
 a semiconducting matrix transmissive to infrared radiation and having a dielectric constant of at least about 10;
 an array of particles of an electrically conducting material embedded in and dispersed through said matrix, said particles having sizes of from about 1 to about 100 nanometers and having a volume fraction of at least about 10 percent of the material, there being no reactive phase present between said particles and said matrix, whereby said material absorbs infrared radiation having wavelengths of greater than about 800 nanometers.

6. The material of claim 5, wherein said particles are selected from the group consisting of silver and gold.

7. The material of claim 5, wherein said matrix is selected from the group consisting of silicon and CuInSe$_2$.

8. The material of claim 5, wherein said particles have sizes of from about 2.5 to about 20 nanometers.

9. The material of claim 5, wherein said particles have a size of about 5 nanometers.

10. The material of claim 5, wherein the volume fraction of said particles is from about 20 to about 80 pecent.

11. The material of claim 5, wherein a portion of said particles are clustered together.

* * * * *